(12) United States Patent
Roge et al.

(10) Patent No.: US 7,660,167 B1
(45) Date of Patent: Feb. 9, 2010

(54) MEMORY DEVICE AND METHOD FOR FAST CROSS ROW DATA ACCESS

(75) Inventors: Manoj Roge, San Jose, CA (US); Rajesh Manapat, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 294 days.

(21) Appl. No.: 11/391,535

(22) Filed: Mar. 28, 2006

Related U.S. Application Data (60) Provisional application No. 60/667,149, filed on Mar. 31, 2005.

(51) Int. Cl.
G11C 7/10 (2006.01)
(52) U.S. Cl. .............................. 365/189.05; 365/230.06; 365/230.08
(58) Field of Classification Search ........ 365/189.05 O, 365/230.03, 230.06 X, 230.08 X, 230.09, 365/189.05, 230.08
See application file for complete search history.

(56) References Cited

U.S. PATENT DOCUMENTS

| 5,285,421 | A | | 2/1994 | Young et al. | |
|---|---|---|---|---|---|
| 5,768,215 | A | * | 6/1998 | Kwon et al. | 365/238.5 |
| 5,806,082 | A | * | 9/1998 | Shaw | 711/104 |
| 6,128,244 | A | * | 10/2000 | Thompson et al. | 365/230.03 |
| 6,477,082 | B2 | | 11/2002 | Pekny et al. | |
| 6,510,097 | B2 | | 1/2003 | Fukuyama | |
| 6,944,087 | B2 | * | 9/2005 | Kanapathippillai et al. | 365/230.06 |

* cited by examiner

*Primary Examiner*—VanThu Nguyen

(57) ABSTRACT

A memory device can provide burst access to row boundary crossing addresses without introducing inter-burst latency. Address locations for a first row of the burst can be accessed at speed, while a prefetch latch can be accessed in lieu of a next row.

17 Claims, 9 Drawing Sheets

MEMORY DEVICE AND METHOD FOR FAST CROSS ROW DATA ACCESS

This application claims the benefit of U.S. Provisional Patent Application Ser. No. 60/667,149, filed Mar. 31, 2005, the contents of which are incorporated by reference herein.

TECHNICAL FIELD

The present invention relates generally to memory devices, and more particularly to memory devices that can provide burst accesses to data storage locations within a memory device.

BACKGROUND OF THE INVENTION

Memory devices can store data values for access by other devices of a system. To increase overall access speeds from some applications, data locations can be accessed in a sequential fashion, often referred to as a "burst" access. In one conventional approach, a memory device can have a burst length set by a user or hardwired into device. In a burst access operation (e.g., read or write), an initial address can be provided to the memory device. In response, the memory device can access the initial address, and a follow sequence of addresses up to the burst length. Address progression can be according to various counting conventions, including linear and interleaved.

Provided a burst access begins and ends within a same row of a memory cell array, such an access introduces essentially no change in latency between data values accessed (access is "at speed"). However, if a burst access spans rows, delays may be introduced. To better understand features of the disclosed embodiments, a conventional memory device and burst will now be described with reference to FIGS. 19 and 20.

Figure 19:
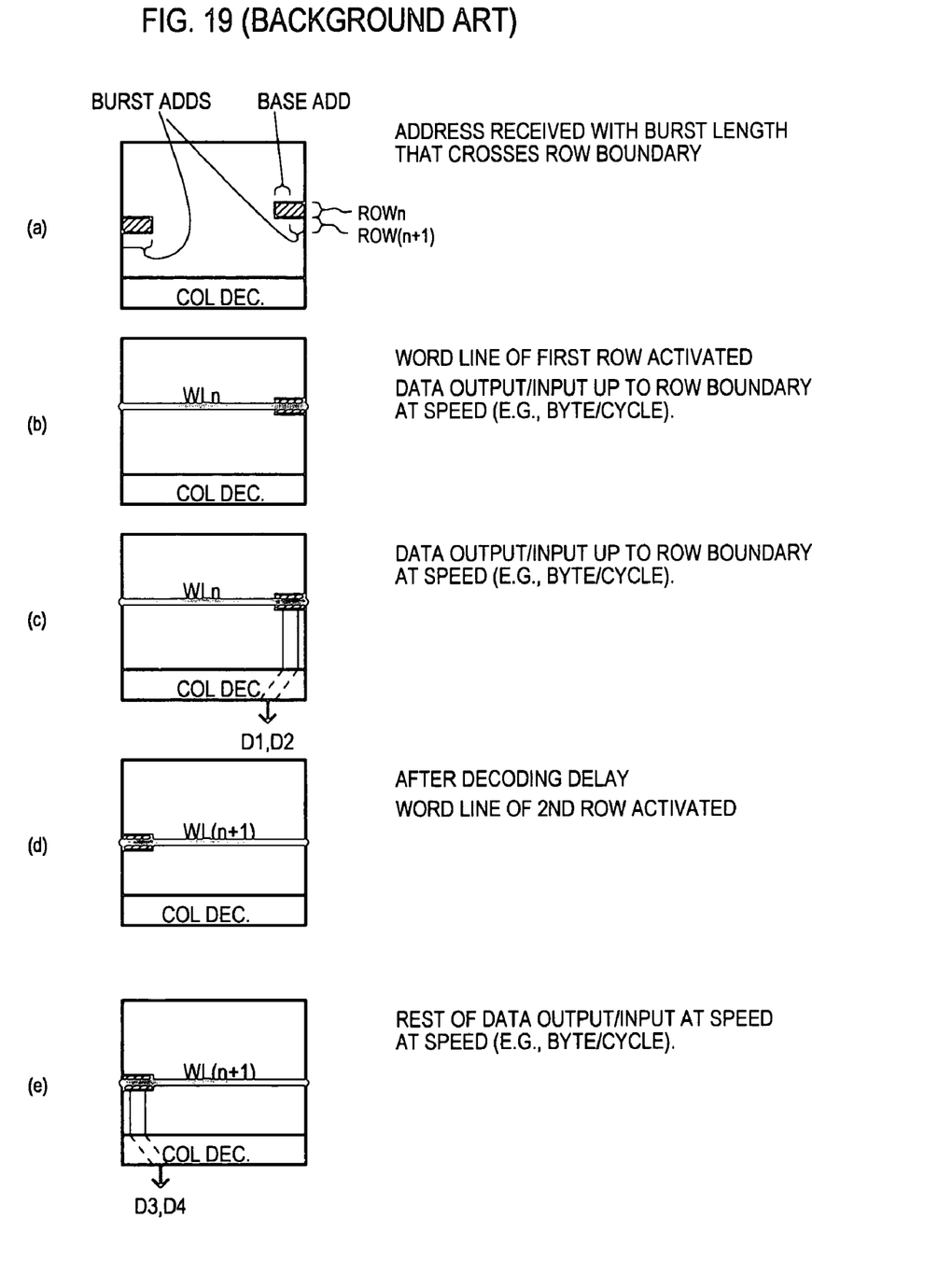
FIG. 19 is a series of block diagrams showing a conventional burst access that crosses a row boundary.

FIG. 19 shows a conventional arrangement in which a burst access across rows can introduce a latency into data access speeds. FIG. 19(a) illustrates how a burst access can have a base address BASE ADD which indicates a first data location of a burst access, as well as one or more burst addresses BURST ADDS that follow the base address. As shown in FIG. 19(a), a burst sequence crosses a row boundary, with part of the burst sequence accessing a row (ROWn) and the remainder of the burst sequence accessing the next row (ROW(n+1)).

FIGS. 19(b) to 19(e) show how latency can be introduced into the burst access illustrated by FIG. 19(a). Referring to FIG. 19(b), at the start of the burst access, a word line WLn can be activated that corresponds to ROWn. As shown in FIG. 19(c), data locations can then be accessed for those portions of the burst directed to ROWn.

However, after ROWn is accessed, a memory device will cycle through access operations (precharge, decode, etc.). After some delay, as shown in FIG. 19(d), a next word line WL(n+1) corresponding to ROW(n+1) can be activated. Such data for this next row can then be accessed, as shown in FIG. 19(e).

Figure 20:
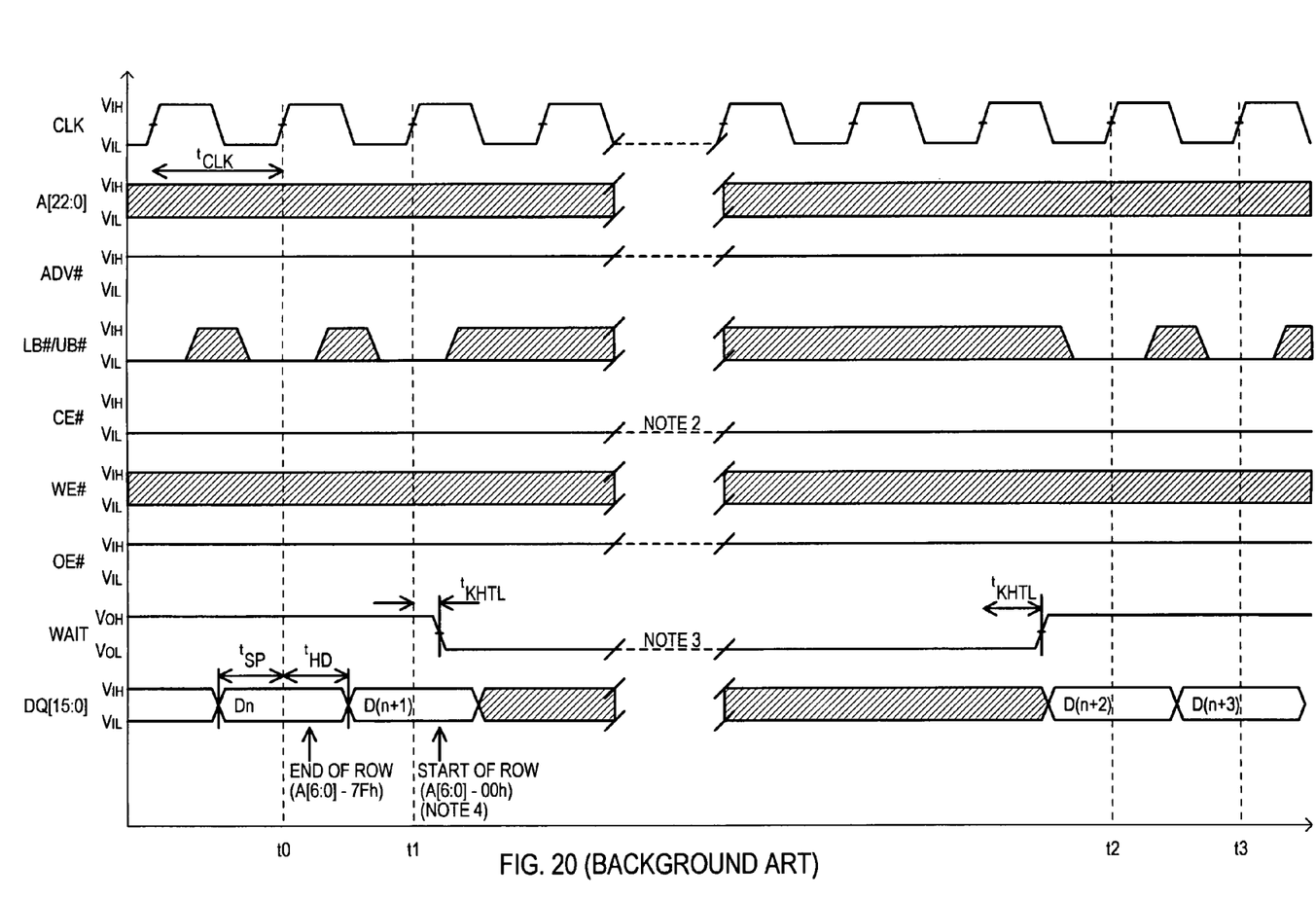
FIG. 20 is a timing diagram showing a conventional burst access that crosses a row boundary.

FIG. 20 is a timing diagram showing the latency effect for a burst write operation that crosses physical rows. At time t0 a first data value (Dn) of a burst sequence can be input. This data value can be a last data value of an initial row. At time t1, a next data value (D(n+1)) of the burst sequence is input. However, this data value corresponds to a first data location of a next row. Consequently, a burst sequence must stop as access is switched from an initial row to the next row. Once access to the next row is established, a burst access can resume at time t2 with the writing of data value D(n+2).

DETAILED DESCRIPTION

Various embodiments of the present invention will now be described in detail with reference to a number of drawings. The embodiments show memory devices and methods that allow for access across physical row boundaries that can introduce essentially no additional latency.

Figure 1:
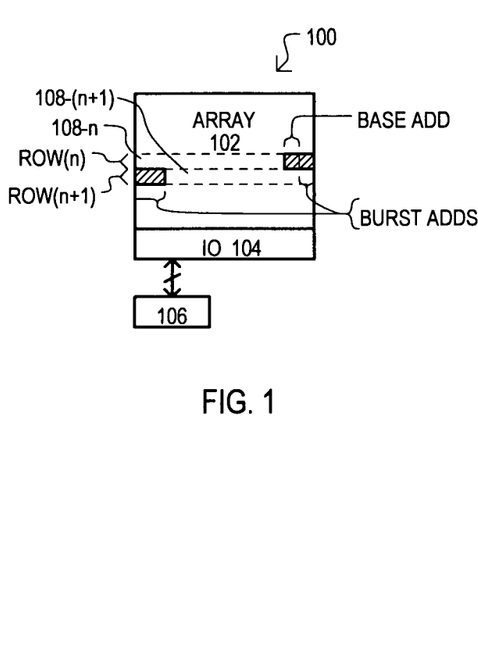
FIG. 1 is a block diagram of a memory device according to a first embodiment.

Referring now to FIG. 1, memory device according to a first embodiment is set forth in block schematic diagram and designated by the general reference character 100. A memory device 100 can include a memory cell array 102, input and/or output (IO) circuitry 104, and a prefetch latch 106.

A memory cell array 102 can include a number of addressable locations arranged into rows and columns. The example of FIG. 1 shows two rows 108-n and 108-n+1. Locations of a burst access are shown as hatching in FIG. 1. Thus, one portion of a burst access is directed to the end of row 108-n, while the remainder of the access is directed to row 108-n+1.

IO circuitry 104 can be circuitry for enabling access to memory cells of array 102. Complexity of such circuitry can vary between configurations. For example, in one arrangement 10 circuitry 104 may include sense amplifiers, while in another arrangement such circuitry can include sense amplifiers and column decoders.

A prefetch latch 106 can be connected to at least a first portion of each row in array 102. In one arrangement a prefetch latch 106 can be large enough to accommodate a worst case row crossing condition in which the first data value of the burst access is a last address of a row. Thus, if a burst length is given as BLEN, the size of the prefetch latch can be BLEN-1.

Figure 2:
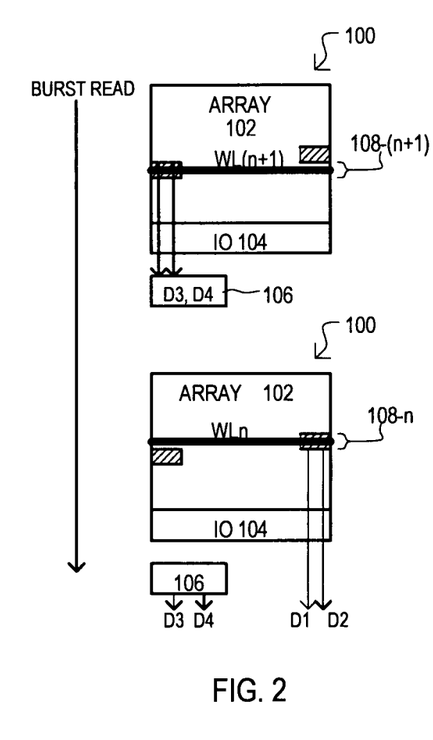
FIG. 2 includes block schematic diagrams that show a burst read access that crosses row boundaries for the embodiment of FIG. 1.
Figure 3:
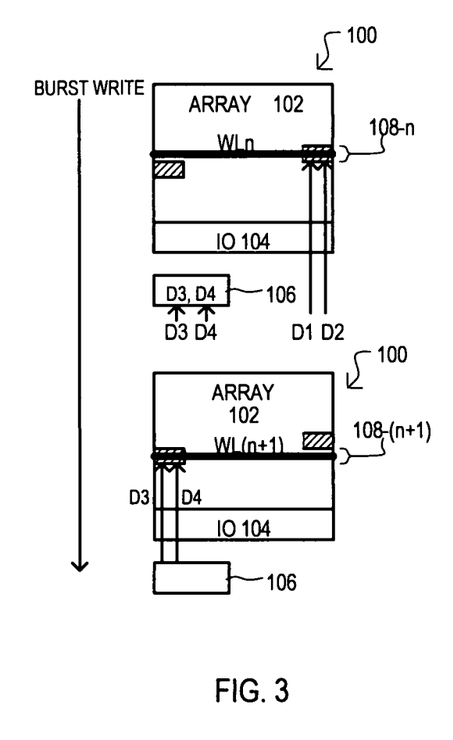
FIG. 3 includes block schematic diagrams that show a burst write access that crosses row boundaries for the embodiment of FIG. 1.

The operation of the memory device 100 of FIG. 1 is shown in FIGS. 2 and 3.

FIG. 2 shows one example of a read burst access in two block diagrams representing one state, and a subsequent state. A topmost diagram shows a first state occurring in response to a burst read command, with the lower diagram showing the subsequent state. In response to a burst read command, memory device 100 can determine if the access will cross a boundary between rows. In such a case, read data can be prefetched. In the example shown, it is assumed that a read access is directed to row 108-n (ROWn) and a row 108-n+1 (ROW(n+1)).

Unlike conventional approaches like that of FIG. 19 that access a row containing a base (first) address of a burst, in the example FIG. 2, memory device 100 can access a next row ROW(n+1) by activating a corresponding word line WL(n+1). Read data of the burst access residing in ROW(n+1), D3, D4, can be output and stored in prefetch latch 106. Subsequently, a memory device 100 can access a starting row ROWn of the burst by activating the corresponding word line WLn. Read data from ROWn, D1, D2, can then be output at normal burst speed. When the burst transitions the row boundary address from ROW(n+1) to ROWn, read data for the next row D3, D4 are output from the prefetch latch, in lieu of accessing ROW(n+1).

In this way, in a read operation, data may be burst out at normal speed across the row boundary without any additional latency introduced within the burst access.

FIG. 3 shows one example of a write burst access. As in the case of FIG. 2, a topmost diagram shows a first state occurring in response to a burst write command, and the lower diagram shows a subsequent state of the same access. In response to a burst write command, a memory device can determine if the access will cross a boundary between a ROWn and the next row ROW(n+1). In such a case, a word line of the first row of the burst WLn can be activated, and data for the row D1, D2 can be written into the row. For the next row of the burst, ROW(n+1), data D3, D4 can be written into the prefetch latch and not ROW(n+1). After the burst is complete, the word line of the next row can be activated WL(n+1), and data D3,D4 from the prefetch latch can be written into the row.

In this way, in a write operation, data may input at normal speed across the row boundary without any additional latency introduced within the burst access.

FIGS. 1-3 show examples of burst accesses that span rows of a same memory array. However, other embodiments can address accesses that span rows of different arrays. Particular examples of such embodiments are shown in FIGS. 4-5.

Figure 4:
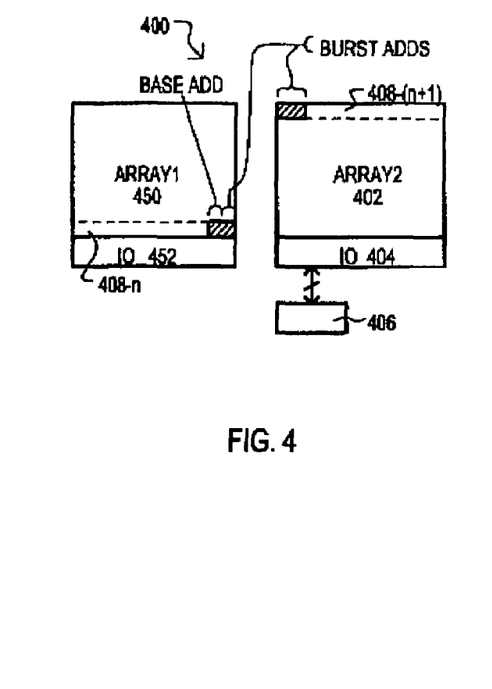
FIG. 4 is a block schematic diagram of a memory device according to a second embodiment.

FIG. 4 shows a block schematic diagram of a memory device according to a second embodiment. The embodiment of FIG. 4 can include some of the same general sections as FIG. 1, thus like sections are referred to by the same reference character but with the first digit being a "4" instead of a "1". Unlike FIG. 1, memory device 400 can include a second memory cell array 450 with corresponding 10 circuitry 452. Further, in the illustrates burst accesses, a first row 408-n (ROWn) can be a last row of memory cell array 450, while the next row 408-n+1 can be a first row of memory cell array 402.

Figure 5:
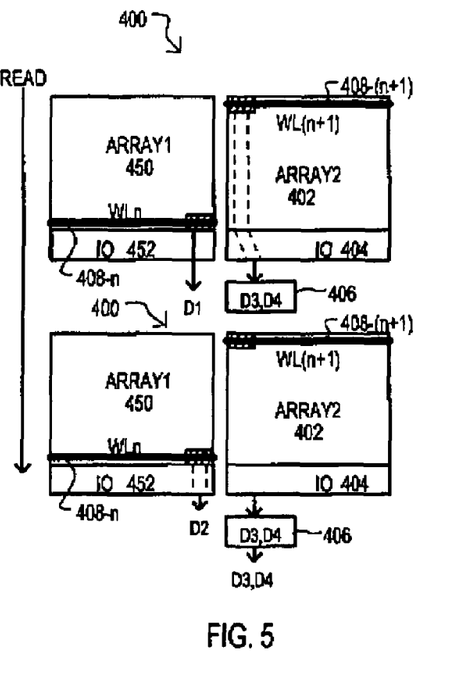
FIG. 5 includes block schematic diagrams that show a burst read access that crosses array row boundaries for the embodiment of FIG. 4.

FIG. 5 shows a burst read access similar to that of FIG. 2. However, unlike FIG. 2, in FIG. 5 in response to a burst read command that crosses from one array to the next, a memory device 400 can access both rows by activating corresponding word lines (Wn and WL(n+1)). Such activation can be sequential (i.e., first W(n+1) then Wn). Alternatively, such activation can be simultaneous. Read data of the burst access residing in ROW(n+1), D3, D4, can be stored in a prefetch latch 406. Read data from ROWn, D1, D2, can be output at normal burst speed. When the burst transitions row boundary addresses, read data for the next row D3, D4 can be output from the prefetch latch 106, in lieu of accessing ROW(n+1).

In this way, the data may be burst out at normal speed across array boundaries without any additional latency.

Figure 6:
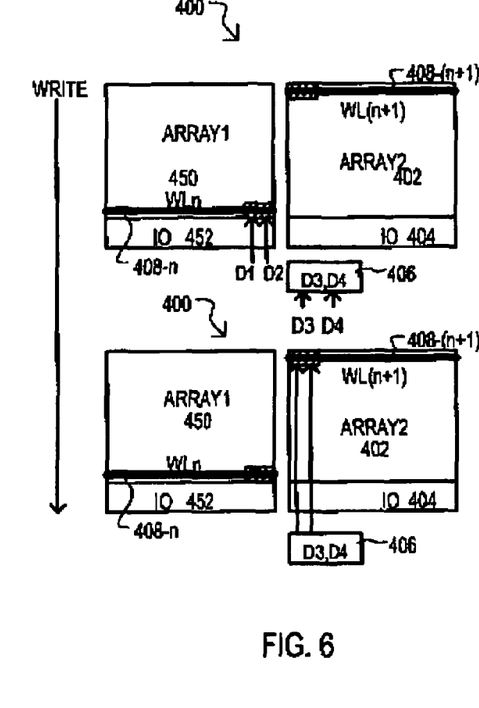
FIG. 6 includes block schematic diagrams that show a burst write access that crosses array row boundaries for the embodiment of FIG. 4.

FIG. 6 is a block schematic diagram showing a write burst access. In response to a burst write command, memory device can determine if the access will cross a boundary between a ROWn of memory cell array 450 and next row ROW(n+1) of memory cell array 402. If this is the case, corresponding word lines (Wn and WL(n+1)) can be activated. Such activation can be sequential, or alternatively, can be simultaneous. Data for the first row D1, D2 can be written into the row. For the next row of the burst ROW(n+1), data D3, D4 can be written into the prefetch latch 106 and not ROW(n+1). In the case of simultaneous activation of both word lines, data D3, D4 may be written directly into ROW(n+1).

In this way, the data may be written at normal speed across array boundaries without any additional latency.

Figure 7:
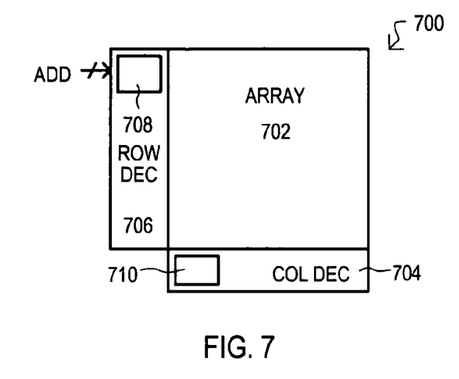
FIG. 7 is block schematic diagram showing memory device according to third embodiment.

Referring now to FIG. 7, a block schematic diagram of a memory device according to a third embodiment is shown and designated by the general reference character 700. A memory device 700 can include a memory cell array 702, a column select circuit 704 and a row decoder 706. A memory cell array 702 can include memory cells arranged into rows and columns, where such rows and columns are accessed according to decoders 706 and 704, respectively.

A row decoder 706 can receive and applied address ADD include an address detection circuit 708 that can determine if a burst access will cross row boundaries. In addition, a row decoder can be modified to activate word lines of sequential rows, as noted above.

A column select circuit 704 can include a modified section 710 having a prefetch latch and column select circuitry for loading/outputting data into/from the prefetch latch.

Figure 8:
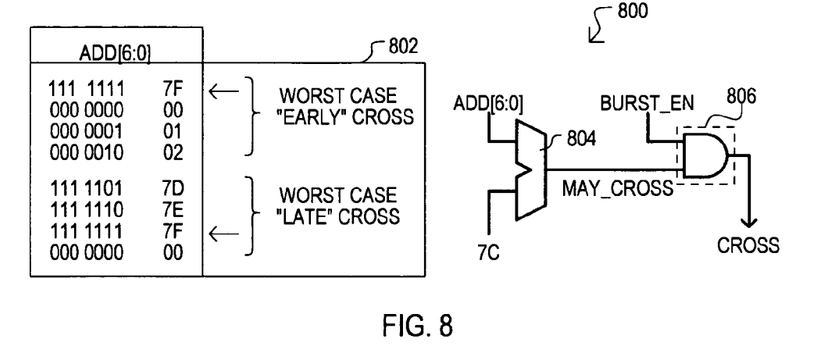
FIG. 8 is a schematic diagram of an address detect circuit that can be included in embodiments.

Referring now to FIG. 8, one example of an address detect circuit, like that shown as 708 in FIG. 7, is shown in a block schematic diagram and designated by the general reference character 800. The example of FIG. 8 shows the particular case for a four address burst. However, larger burst addresses are readily understood from this example. The illustrated example also assumes that a row boundary cross occurs at the address transition ADD=7F(hex) to ADD=00(hex), where ADD represents a portion of an applied address.

Table 802 shows how worst case "early" and worst case "late" row crosses can be determined. A worst case early row cross is one in which a first address of a burst is to a last location of a row. A worst case late row access is one in which a second to last address of a burst is directed to a last location of a row. From the illustration it is understood that a comparison operation can be used to determine if an access will cross a row. In the very particular example illustrated, a base address portion (ADD[6:0]) can be compared against a preset address (in this example 7C(hex)) to indicate when a burst is within a row crossing range (assuming higher order bits have already indicated the array).

The very particular address detect circuit 800 thus includes a comparator 804 and logic 806. Comparator 804 can generate a high output signal MAY_CROSS based on a comparison between a received address (or portion thereof) and an indicated limit. Logic 806 can generate an active cross signal CROSS based on other conditions of memory device. In FIG. 8, logic 806 can include an AND gate that logically combines a burst enable signal BURST_EN that can indicate a burst access. Such an arrangement can prevent signal CROSS from being activated in non-burst accesses.

Of course, FIG. 8 represents but one of many possible implementations, and should not be construed as limiting the invention thereto.

Figure 9:
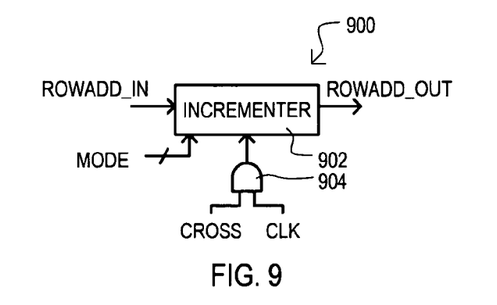
FIG. 9 is a schematic diagram of a modified row decoder that can be included in an embodiment.

FIG. 9 shows one example of modified row decoder 900 circuit like that shown as 706 in FIG. 7. Modified row decoder 900 can include an incrementer circuit 902 and control logic 904. An incrementer circuit 902 can receive a row address ROWADD_IN, and output a received address, or incremented version of such a row address as an output address ROWADD_OUT. Output address ROWADD_OUT can be decoded to activate a corresponding word line according to conventional approaches.

Control logic 904 can allow incrementing of rows to take place in the event burst access crosses rows. In the example shown, control logic 904 can include an AND gate that received a CROSS signal that indicates a row cross condition, as well as clock signal CLK.

Figure 10A:
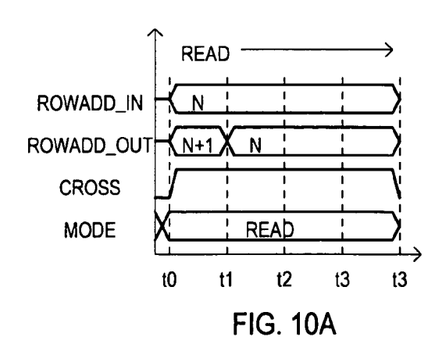
FIGS. 10A and 10B are timing diagrams showing the operation of the modified row decoder of FIG. 9.
Figure 10B:
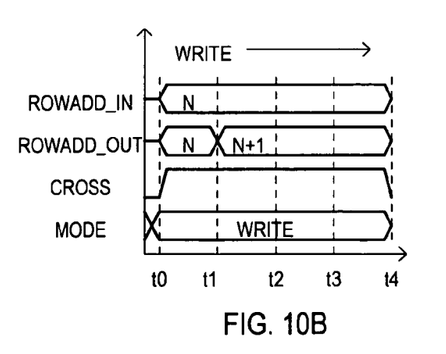

The operation of modified row decoder 900 circuit is shown in FIGS. 10A and 10B. FIG. 10A is a timing diagram showing burst read operation that crosses from a row address N to a next row address N+1. Referring to FIG. 9 in conjunction with FIG. 10A, a row address for the first row of a burst (ROWADD_IN) can be received by an incrementer circuit 902. An incrementing operation of incrementer circuit 902 can be controlled according to a mode value MODE and control logic 904, as noted above. Mode value MODE can indicate whether an access is a read or write operation, and can be generated by conventional command decoding techniques.

Referring still to FIGS. 9 and 10A, at time t0, incrementer circuit 902 can provide an output row address ROWADD_OUT that is incremented from N to N+1, thus enabling a prefetch operation to occur, with data from a row having address N+1 being read into a prefetch latch.

At time t1, incrementer circuit 902 can output originally received row address N. This can enable a burst read access to begin at the row having address N. It is understood that when the burst proceeds to data of a next row, such data can be output from the prefetch latch.

FIG. 10B is a timing diagram showing burst write operation that crosses from a row address N to a next row address N+1. Referring to FIG. 9 in conjunction with FIG. 10B, a row address for the first row of a burst write (ROWADD_IN) can be received by incrementer circuit 902. Again, the incrementing operation of incrementer circuit 902 can be controlled according to a mode value MODE and control logic 904, as noted above. Because, FIG. 10B shows a write operation, such incrementing will be different from that of the read operation of FIG. 10A.

Referring still to FIGS. 9 and 10B, at time t0, incrementer circuit 902 can provide an output row address ROWADD_OUT of a first accessed row (N). It is understood that at about this time, write data for row address N+1 can be written into a prefetch latch.

At time t1, incrementer circuit 902 can output incremented row address N+1. This can enable a burst write data within a prefetch latch to be written into row N+1.

Of course, as in the case of FIG. 8, FIG. 9 represents but one of many possible implementations, and should not be construed as limiting the invention thereto.

Figure 11:
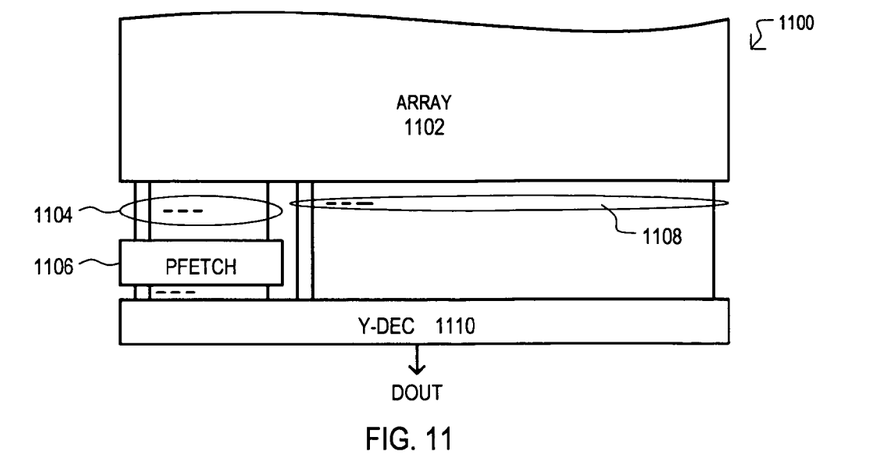
FIG. 11 is a block schematic diagram showing a prefetch latch/column select circuit arrangement according to one embodiment.

Referring now to FIG. 11, a memory device according to another embodiment is shown in a block schematic diagram and designated by the general reference character 1100. A memory device 1100 can include a memory cell array 1102, latch transfer lines 1104, a prefetch latch 1106, direct transfer lines 1108, and a column select circuit 1110. FIG. 11 shows an arrangement in which a modified column select circuit arrangement can include a prefetch latch 1106 situated between memory cell array 1102 and column select circuit 1110.

In one very particular approach, latch transfer lines 1104 and direct transfer lines 1108 can be bit lines having a direct access to columns of memory cells.

A memory cell array 1102 can include memory cells arranged into rows and columns, with portions of each row being coupled to prefetch latch 1106 by latch transfer lines 1104. Memory cells within array 1102 can comprise random access memory (RAM) cells, preferably dynamic RAM (DRAM) cells forming a pseudo-static RAM (PSRAM) array.

A prefetch latch 1106 can store data for a burst access in lieu of a row access as noted above. Direct transfer lines 1108 can provide access to columns without connection to prefetch latch 1106.

A column select circuit 1110 can be essentially conventional in structure, operating in response to a "wrapping" column address. That is, after a column select circuit has accessed a last column (e.g., 7FF(hex)) it can proceed to the next column without delay (e.g., 000(hex)), assuming the non-latency approach is in effect. Accordingly, in a burst read access that crosses row boundaries, column select circuit 1110 can receive a first portion of a burst read sequence from direct transfer lines 1108 and remainder of such a sequence from prefetch latch 1106. Similarly, in a burst write access that crosses row boundaries, column select circuit 1110 can output a first portion of a burst write sequence to direct transfer lines 1108 and remainder of such a sequence into prefetch latch 1106.

In this way, a prefetch latch 1106 can be situated between a column select circuit 1106 and a memory cell array 1102.

Figure 12:
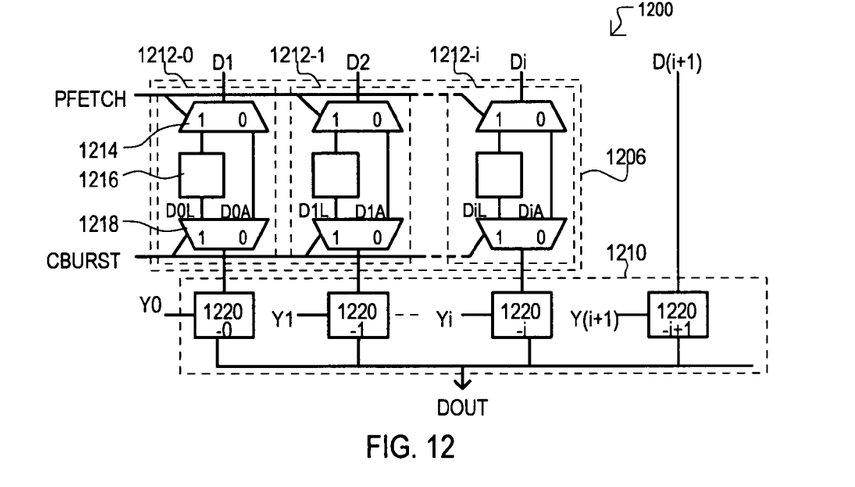
FIG. 12 is a detailed schematic diagram showing a prefetch latch/column select circuit arrangement according to another embodiment.

Referring now to FIG. 12, a more detailed example of a prefetch latch arrangement like that of FIG. 11 is shown in a block schematic diagram and designated by the general reference character 1200. Prefetch latch arrangement 1200 shows a prefetch latch 1206 and a column select circuit 1210. A prefetch latch 1206 can include a number of data paths 1212-0 to 1212-i having the same general construction. Accordingly, only the structure of data path 1212-0 will be described in detail.

A data path 1212-0 can include a first multiplexer/demultiplexer (MUX/DEMUX) 1214, a bit latch 1216, and a second MUX/DEMUX 1218. A first MUX/DEMUX 1214 can be controlled according to a prefetch signal PREFETCH, and be connected between and memory cell array and bit latch 1216. A second MUX/DEMUX 1218 can be controlled according to a cross burst signal CBURST, and be connected between bit latch 1216 and column select circuit 1210.

A column select circuit 1210 can include a number of column passgates 1220-0 to 1220-(i+1). Each column passgate (1220-0 to 1220-(i+1)) can be controlled according to a corresponding column select circuit signal Y0 to Y(i+1) generated in response to a column select circuit that can include a burst address generator.

Figure 13:
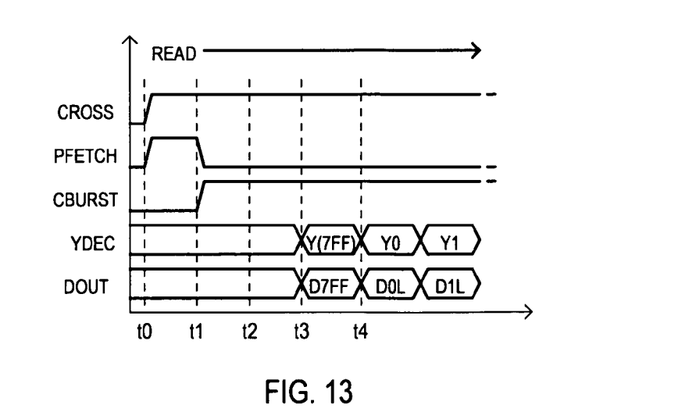
FIG. 13 is a timing diagram showing a burst read operation for the circuits of FIGS. 12 and 16.

One example of control signals for a burst read operation for the arrangement of FIG. 12 is shown in FIG. 13. One example of control signals for a burst write operation for the arrangement of FIG. 12 is shown in FIG. 14.

Referring now to FIG. 12 in conjunction with FIG. 13, in the burst read operation shown, at time t0, prefetch signal PFETCH can transition high, allowing read data to be loaded into bit latches (e.g., 1216). At this time cross burst signal CBURST can be low. Subsequently, at time t1, signal CBURST can transition high, allowing data stored in prefetch latch 106 to be output to column select circuit 1210. As shown at times t3 and t4, data may then be sequentially burst out from prefetch latch 1206 by conventional column select circuit passgates (1220-0 to 1220-(i+1)).

Figure 14:
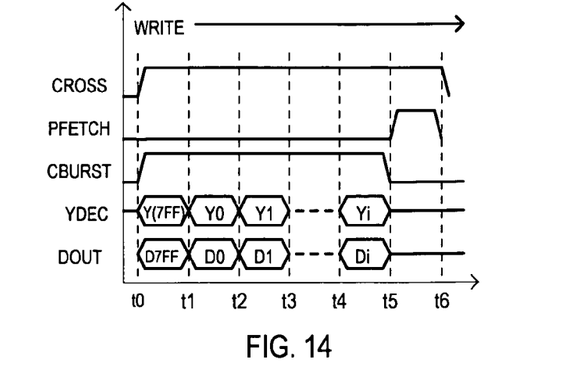
FIG. 14 is a timing diagram showing a burst write operation for the circuits of FIGS. 12 and 16.

Referring now to FIG. 12 in conjunction with FIG. 14, in the burst write operation shown, at time t0, cross burst signal CBURST can transition high, allowing write data to be written into a first row of an access (at time t0) as well as prefetch latch 1206 at times t1 to t4. At time t5, such latched data may then be written into the array by operation of prefetch signal PFETCH going high.

Figure 15:
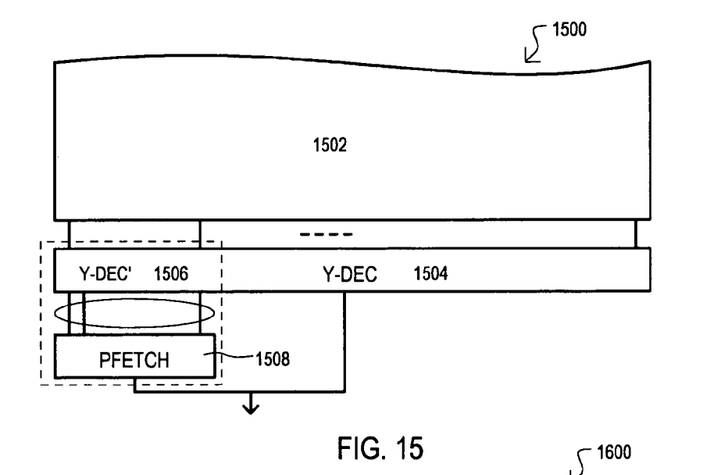
FIG. 15 is a block schematic diagram showing a prefetch latch/column select circuit arrangement according to another embodiment.

Referring now to FIG. 15, a memory device according to another embodiment is shown in a block schematic diagram and designated by the general reference character 1500. A memory device 1500 can include a memory cell array 1502, standard column select circuit section 1504, modified column select circuit section 1506, and prefetch latch 1508. FIG. 15 shows a modified column select circuit arrangement in which a column select circuit 1504/1506 can be situated between memory cell array 1502 and prefetch latch 1508. In such an arrangement, a column select circuit 1504/1506 can be modified to output data into prefetch latch 1508, and column decoding signals can be used to access prefetch latch locations.

Figure 16:
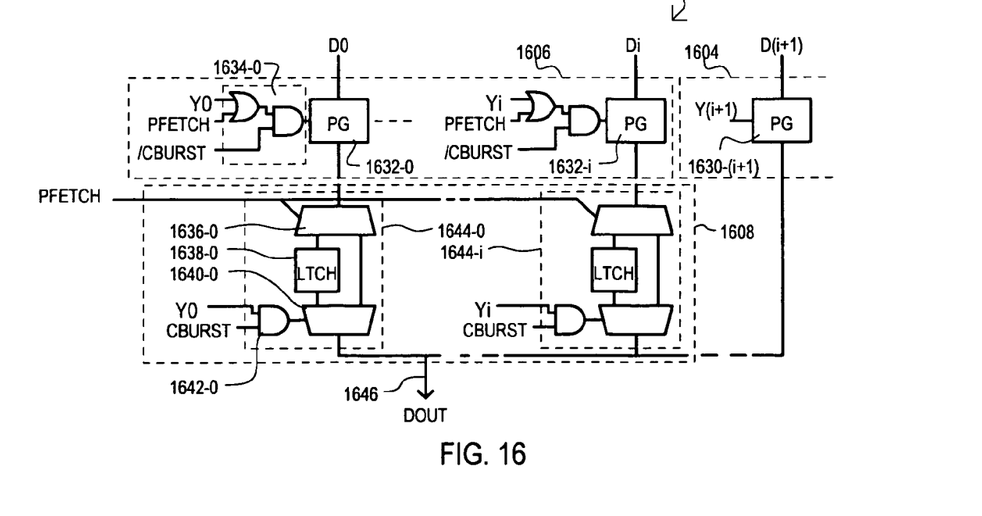
FIG. 16 is a detailed schematic diagram showing a prefetch latch/column select circuit arrangement according to another embodiment.

FIG. 16 shows more detailed example of a prefetch latch arrangement like that of FIG. 15. Arrangement 1600 of FIG. 16 shows a standard column select circuit section 1604, a modified column select circuit 1606, and a prefetch latch 1608. A standard column select section 1604 can include a number of column passgates (one of which is shown as 1630-(i+1)), each controlled by a corresponding column select signal (one of which is shown as Y-(i+1)). Column select signals can be generated by decoding a portion of a received address value.

Modified column select section 1606 can also include column passgate, but may be controlled based on additional signals. A column passgate arrangement for data value D0 will now be described in detail, it being understood that the other column passgate arrangements operate in the same fashion. Within modified column select section 1606, a data path for value D0 can include a column passgate 1632-0 activated according to control logic 1634-0. In such an arrangement, column passgate 1632-0 can be controlled by a prefetch signal PFETCH and an inverse cross burst signal/ CBURST.

A prefetch latch 1608 can include a number of data paths 1644-0 to 1644-i having the same general construction. Accordingly, only the structure of data path 1644-0 will be described in detail. Data path 1644-0 can include a first MUX/ DEMUX 1636-0, a bit latch 1638-0, and a second MUX/ DEMUX 1640-0. A first MUX/DEMUX 1636-0 can be controlled according to a prefetch signal PREFETCH, and be connected between modified column select section 1606 and bit latch 1638-0. A second MUX/DEMUX 1640-0 can be controlled according to logic 1642-0, which can receive a column select signal Y0 and a cross burst signal CBURST, and can be connected between bit latch 1638-0 and a data bus line 1646.

In a burst read operation, data can be loaded into bit latches (e.g., 1638-0) by activation of a prefetch signal PFETCH. Data may then be sequentially burst out of such latches by second MUX/DEMUXs (e.g., 1640-0) based on column select signals and signal CBURST.

In a burst write operation, data can be sequentially loaded into latches via second MUX/DEMUXs (e.g., 1640-0) by activation of a cross burst signal CBURST and appropriate select signals. Such latched data may then be written into the array via first MUX/DEMUXs (e.g., 1636-0) by operation of prefetch signal PFETCH. While FIG. 16 may have more logic than FIG. 11, such an arrangement may be more easily implemented with existing memory layouts.

Figure 17:
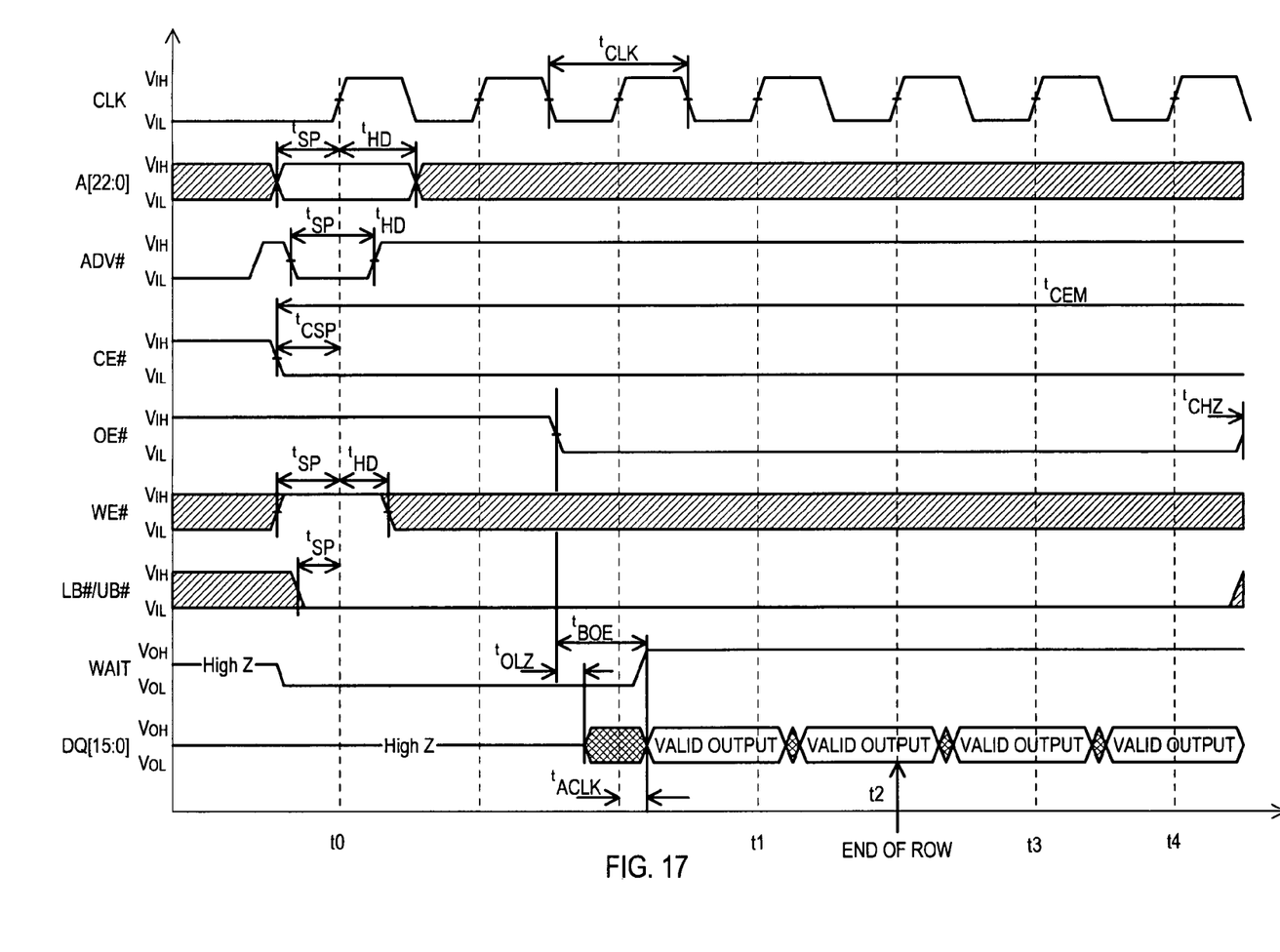
FIG. 17 is a timing diagram showing a burst access that crosses a row boundary according to a specific embodiment.

Referring now to FIG. 17, a timing diagram shows how a burst access can be achieved without introducing inter-burst latency according to an embodiment. It is assumed that a burst read access starts at a row ROWn crosses to a next row ROW(n+1).

In response to a read address at time t0, a memory device can prefetch data from row ROW(n+1). Next, at time t1, memory device can output a first data value of first row ROWn. A last data value of this first row can be output at time t2. However, because data for next row ROW(n+1) can already have been prefetched, a next data value starting at a new row can be output at time t3, without any interburst latency, as was the case in FIG. 20.

Figure 18:
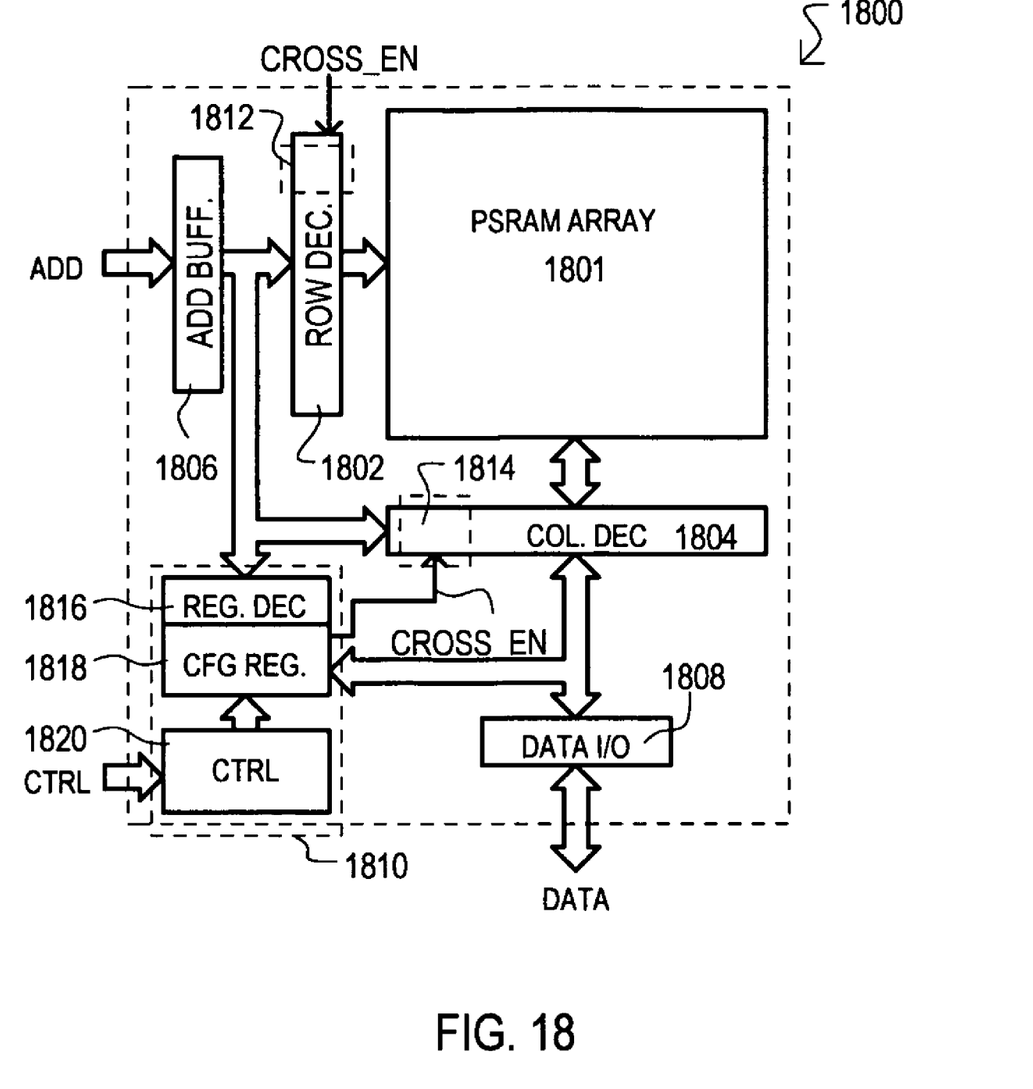
FIG. 18 is a block diagram of a pseudo static random access memory (PSRAM) device according to an embodiment.

Referring now to FIG. 18, a very particular example of a memory device that can utilize approaches shown above is shown in a block schematic diagram and designated by the general reference character 1800. A memory device 1800 can be a pseudo static random access memory (PSRAM) device that includes a PSRAM array 1801, a modified row decoder 1802, a modified column decoder 1804, an address buffer 1806, data I/O section 1808, and a control section 1810.

A PSRAM array 1801 can include a number of PSRAM memory cells arranged into rows and columns. In one arrangement, a PSRAM cell can be a one transistor type cell having a passgate transistor and a capacitor. PSRAM cells of the same row can be commonly connected to a same word line, while PSRAM cells of the same column can be commonly connected to a same bit line.

A modified row decoder 1802 can selectively increment a row address according to any of the various approaches noted above. In addition, a row cross detect circuit 1812 can be included that can operate according to the various examples above, to detect when a burst access will cross row and/or array boundaries. A modified column decoder 1804 can include a prefetch latch/column select arrangement 1814 according to any of the various approaches noted above.

An address buffer 1806 can buffer a received address and provide such values to modified row and column decoders (1802 and 1804). A data I/O section 1808 can include secondary sense amplifiers, write amplifier, and/or additional decoding and/or registers.

A control section 1810 can include a register decoder 1816, a configuration register 1818, and control section 1820. A register decoder 1816 can provide access to configuration register 1818. Configuration register 1818 can provide standard control values, and in addition, can provide a value CROSS EN for selectively enabling the row crossing capabilities noted above. A control section 1820 can provide internal control signals for determining operation type and operation timing.

Of course, while FIG. 18 shows an addressable register used to selectively enable row cross capabilities, alternate approaches can enable such features, including but not limited to, a fuse options, mask option, bond option, to name just a few.

In such an arrangement, a memory device can have the row crossing function enabled for those applications where such a feature is particularly desirable. Such an option may not be enabled if not desired.

Of course, various well-known circuit features have not been shown in FIG. 18 to avoid unduly cluttering the view, such as refresh circuits, and a burst address counter.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method of accessing memory device data, comprising the steps of:
   receiving a command to access a data burst sequence of consecutive addressable locations, the data burst sequence including at least a first data location in a first row and at least a second data location in a second row,
   accessing the data location during the data burst sequence; and
   accessing a prefetch store in lieu of the second data location during the data burst sequence, including accessing the second row to read data into the prefetch store prior to accessing the first row when the command is a read command.

2. The method of claim 1, wherein:
   the command is the read command;
   the first row is in a first memory cell array and the second row is in a second memory cell array; and
   accessing the prefetch store in lieu of the second data location includes accessing the second row to read data into the prefetch store no later than accessing the first row.

3. The method of claim 1, wherein:
   the command is a write command; and
   accessing the prefetch store in lieu of the second data location includes accessing the second row to write data from the prefetch store after accessing the first row.

4. A memory device, comprising:
   at least one array having memory cells arranged into plurality of rows, each row having a first portion and a second portion;
   a prefetch store coupled to receive data from the first-portion of each row and not the second portion of each row, the prefetch store storing data corresponding to the first portion of a row in response to a row cross indication; and
   a row cross detect circuit that activates the row cross indication when a burst data sequence accesses locations that span a row boundary,
   wherein the memory device has a maximum burst size of N and the prefetch store stores no more than N−1 data values.

5. The memory device of claim 4, wherein:
   a row decoder that activates adjacent row word lines in response to the row cross indication.

6. The memory device of claim 5, wherein:
   a command decoder that determines when a burst read command is received starting at a row address N; and
   in response to a burst read command, the row decoder activates a word line at row address N+1 to store read data in the prefetch store for subsequent output during the data burst sequence, and activates row address N to output read data for the burst sequence.

7. The memory device of claim 5, wherein:
   a command decoder that determines when a burst write command is received starting at a row N;
   the prefetch store receives write data during the data burst sequence; and
   in response to a burst write command, the row decoder activates a word line at row address N+1 to write data from the prefetch store, and activates row address N to write data during the burst sequence.

8. The memory device of claim 4, wherein:
   the at least one array is a pseudo static random access memory (PSRAM) array.

9. A memory device, comprising:
   at least a first memory cell array having a plurality of memory cells arranged into physical rows and accessed according to logical addresses;
   a prefetch storage circuit coupled in parallel to a portion of each row and coupled between columns of the at least first memory cell array and a column select circuit of the at least first memory cell array, the prefetch storage circuit including a plurality of multiplexing (MUXing) circuits, each MUXing circuit having a control input, one signal input and a plurality of signal outputs, one of the signal outputs being coupled to a corresponding prefetch latch; and
   an address detect circuit coupled to receive a first physical address of a burst access, the address detect circuit generating a cross indication when the first physical address is within a predetermined proximity to a physical address at a boundary of a row.

10. The memory device of claim 9, wherein:
    the address detect circuit includes a comparator having a first input coupled to receive at least a portion of the first physical address and a second input coupled to receive an address limit value.

11. The memory device of claim 9, wherein:
    the physical address at a boundary of a row is selected from the group consisting of a physical address of a last memory cell of a row prior to a first address of a next row, and a physical address of a last memory cell of the at least first memory cell array prior to a first address of a second memory cell array.

12. The memory device of claim 9, wherein:
    at least a first memory cell array includes a row decoder that enables access to the physical rows, the row decoder including a row address incrementer that increments a row address in response to the cross indication.

13. The memory device of claim 9, wherein:
the prefetch storage circuit comprises
- a plurality of prefetch latches that each store one bit of data, and
- a plurality of prefetch access circuits, each prefetch access circuit being coupled between a different column of the at least one memory cell array and a corresponding one of the prefetch latches, the prefetch access circuits being enabled in parallel in response to the cross indication.

14. The memory device of claim 13, further including,
the prefetch storage circuit further comprises
a plurality of prefetch output circuits, each prefetch output circuit corresponding to one of the prefetch latches and being coupled between at least one data output bus and a corresponding one of the prefetch latches.

15. The memory device of claim 9, wherein:
a select circuit is coupled between columns of the at least first memory cell array and the storage circuit.

16. The memory device of claim 9, wherein:
the prefetch storage circuit further includes
- each prefetch latch storing one bit of data, and
- each MUXing circuit having a selection input and being enabled in response to at least the cross indication.

17. The memory device of claim 4, further including:
a configuration store for storing a prefetch enable value; and
the prefetch store and a row cross detect circuit are enabled in response to a value stored in the configuration store.

* * * * *